US011454106B2

(12) United States Patent
Menand

(10) Patent No.: US 11,454,106 B2
(45) Date of Patent: Sep. 27, 2022

(54) GENERATING DRILLING PATHS USING A DRILL MODEL

(71) Applicant: DrillScan France SAS, Villeurbanne (FR)

(72) Inventor: Stephane Menand, Houston, TX (US)

(73) Assignee: DRILLSCAN FRANCE SAS, Villeurbanne (FR)

(*) Notice: Subject to any disclaimer, the term of this patent is extended or adjusted under 35 U.S.C. 154(b) by 343 days.

(21) Appl. No.: 16/619,381

(22) PCT Filed: May 4, 2018

(86) PCT No.: PCT/US2018/031176
§ 371 (c)(1),
(2) Date: Dec. 4, 2019

(87) PCT Pub. No.: WO2018/231363
PCT Pub. Date: Dec. 20, 2018

(65) Prior Publication Data
US 2020/0149386 A1 May 14, 2020

Related U.S. Application Data

(60) Provisional application No. 62/520,287, filed on Jun. 15, 2017.

(51) Int. Cl.
*E21B 45/00* (2006.01)
*E21B 7/10* (2006.01)
(Continued)

(52) U.S. Cl.
CPC ............ *E21B 47/022* (2013.01); *E21B 45/00* (2013.01); *E21B 47/09* (2013.01); *E21B 47/26* (2020.05); *E21B 7/10* (2013.01)

(58) Field of Classification Search
CPC ... E21B 7/04; E21B 7/10; E21B 45/00; E21B 47/02; E21B 47/08; E21B 47/09; E21B 47/26
See application file for complete search history.

(56) References Cited

U.S. PATENT DOCUMENTS 6,568,593 B2   5/2003   Hetzer
7,032,689 B2   4/2006   Goldman et al.
(Continued)

FOREIGN PATENT DOCUMENTS

EP       1274922 B1     1/2003
WO   2016108897 A1     7/2016

OTHER PUBLICATIONS

International Search Report; PCT/US2018/031176 dated Sep. 11, 2018.
(Continued)

*Primary Examiner* — Robert E Fuller
*Assistant Examiner* — Lamia Quaim
(74) *Attorney, Agent, or Firm* — Kilpatrick Townsend & Stockton LLP

(57) ABSTRACT

A method of modeling a wellbore path in an earth model, including receiving, from an electronic drilling recorder coupled to a bottom hole assembly (BHA), a set of BHA data, and a set of operating parameters data and receiving, a set of rock formation data; generating, a representation of a wellbore path in a first section of the earth model, by assessing the set of BHA data, the set of operating parameters data, the set of rock formation data, and a first set of parameters quantifying bit steerability, walk, coefficient of friction, and overgauge borehole information. The method includes modifying, based on data received from a survey corresponding to the first section of the earth model, the first set of parameters to generate a second set of parameters, and (Continued)

generating a future wellbore path in a second section of the earth model by applying the second set of parameters.

17 Claims, 5 Drawing Sheets

(51) Int. Cl.
*E21B 47/26* (2012.01)
*E21B 47/022* (2012.01)
*E21B 47/09* (2012.01)

(56) References Cited

U.S. PATENT DOCUMENTS

| | | | |
|---|---|---|---|
| 7,602,963 | B2 | 10/2009 | Nightingale et al. |
| 7,707,009 | B2 | 4/2010 | Steinke |
| 7,866,413 | B2 | 1/2011 | Stauffer et al. |
| 8,210,283 | B1 | 7/2012 | Benson et al. |
| 8,374,835 | B2 | 2/2013 | Lind et al. |
| 8,596,385 | B2 | 12/2013 | Benson et al. |
| 8,738,342 | B2 | 5/2014 | Lind et al. |
| 8,775,099 | B2 | 7/2014 | Wagner et al. |
| 8,818,729 | B1 | 8/2014 | Benson et al. |
| 8,824,731 | B2 | 9/2014 | Maggiore et al. |
| 8,996,396 | B2 | 3/2015 | Benson et al. |
| RE46,012 | E | 5/2016 | Weston et al. |
| 9,970,266 | B2 | 5/2018 | Marx et al. |
| 10,094,209 | B2 | 10/2018 | Gillan et al. |
| 10,508,530 | B2 | 12/2019 | Gillan |
| 2005/0096847 | A1 | 5/2005 | Huang |
| 2007/0032958 | A1 | 2/2007 | Chen |
| 2009/0120690 | A1* | 5/2009 | Phillips ............. E21B 44/00 175/45 |
| 2011/0213601 | A1* | 9/2011 | Pirovolou ............. E21B 7/04 703/10 |
| 2013/0161097 | A1 | 6/2013 | Benson et al. |
| 2015/0226052 | A1* | 8/2015 | Samuel ............. E21B 47/022 700/275 |
| 2015/0308191 | A1 | 10/2015 | Zhan et al. |
| 2015/0377003 | A1 | 12/2015 | Benson et al. |
| 2016/0076357 | A1 | 3/2016 | Hbaieb |
| 2016/0237756 | A1 | 8/2016 | Da Silva et al. |
| 2016/0312598 | A1 | 10/2016 | Samuel et al. |
| 2017/0030166 | A1 | 2/2017 | Shen et al. |
| 2017/0243383 | A1 | 4/2017 | Gillan et al. |
| 2018/0272491 | A1 | 9/2018 | Yang et al. |
| 2019/0022814 | A1 | 1/2019 | Nakayama |
| 2019/0145183 | A1 | 5/2019 | Potash |
| 2019/0145184 | A1 | 5/2019 | Da Silva et al. |

OTHER PUBLICATIONS

Written Opinion of the International Search Authority; PCT/US2018/031176 dated Sep. 11, 2018.
International Preliminary Report on Patentability; PCT/US2018/031176 dated Dec. 17, 2019.
Julien Marek, et al., "The path to autonomous directional drilling," World Oil, pp. 29-34, Oct. 2018.
AU2018286423, "First Examination Report", dated May 20, 2022, 3 pages.
EP18817860.2, "Extended European Search Report", dated Feb. 22, 2021, 12 pages.
Menand, et al., "How the Bit Profile and Gages Affect the Well Trajectory", Available Online at:https://www.onepetro.org/download/conference-paper/SPE-74459-MS?id-conference-paper/SPE-74459-MS, Feb. 26, 2002, pp. 1-13.

* cited by examiner

GENERATING DRILLING PATHS USING A DRILL MODEL

BACKGROUND

Drilling into the subsurface of the Earth may be an arduous and complicated task. Drilling is expensive and many errors may occur as a driller attempts to drill to a final target location. Drilling a borehole has become increasingly difficult due to the complexity added by drilling long, deviated, or horizontal wells that require accurate and consistent directional drilling. Directional drilling may result in an actual wellbore path that is unintentionally tortuous, as opposed to the planned wellbore which is perfectly smooth. Often directional drillers lack accurate information regarding the actual path of a tortuous wellbore when drilling toward a target location, because of uncertainties linked to the wellbore measurements, directional behavior of the drilling system, or the rock formation.

BRIEF DESCRIPTION OF THE DRAWINGS

For a detailed description of various embodiments, reference will now be made to the accompanying drawings in which.

NOTATION AND NOMENCLATURE

Certain terms are used throughout the following description and claims to refer to particular system components. As one skilled in the art will appreciate, different companies may refer to a component by different names. This document does not intend to distinguish between components that differ in name but not function.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The ability to accurately reconstruct a drilled wellbore path that is tortuous as well as to predict a future wellbore path as drilling continues may be beneficial to entities and individuals tasked with extracting minerals from the Earth. The embodiments described below assess the directional behavior of a drilling system to both reconstruct the drilled wellbore path and predict a future wellbore path. In order to assess directional drilling, the described embodiments take into account several factors including: bit directional responsiveness; mechanical behavior of the directional system (i.e., behavior of a bottom hole assembly); and effect of the rock formation in the drilling environment. In order to accurately reconstruct a drilled wellbore path as well as predict a future wellbore path to guide a drilling system 122, various methods and systems using a drill model that takes into account the several factors including rock formation data, are described below.

Figure 1:
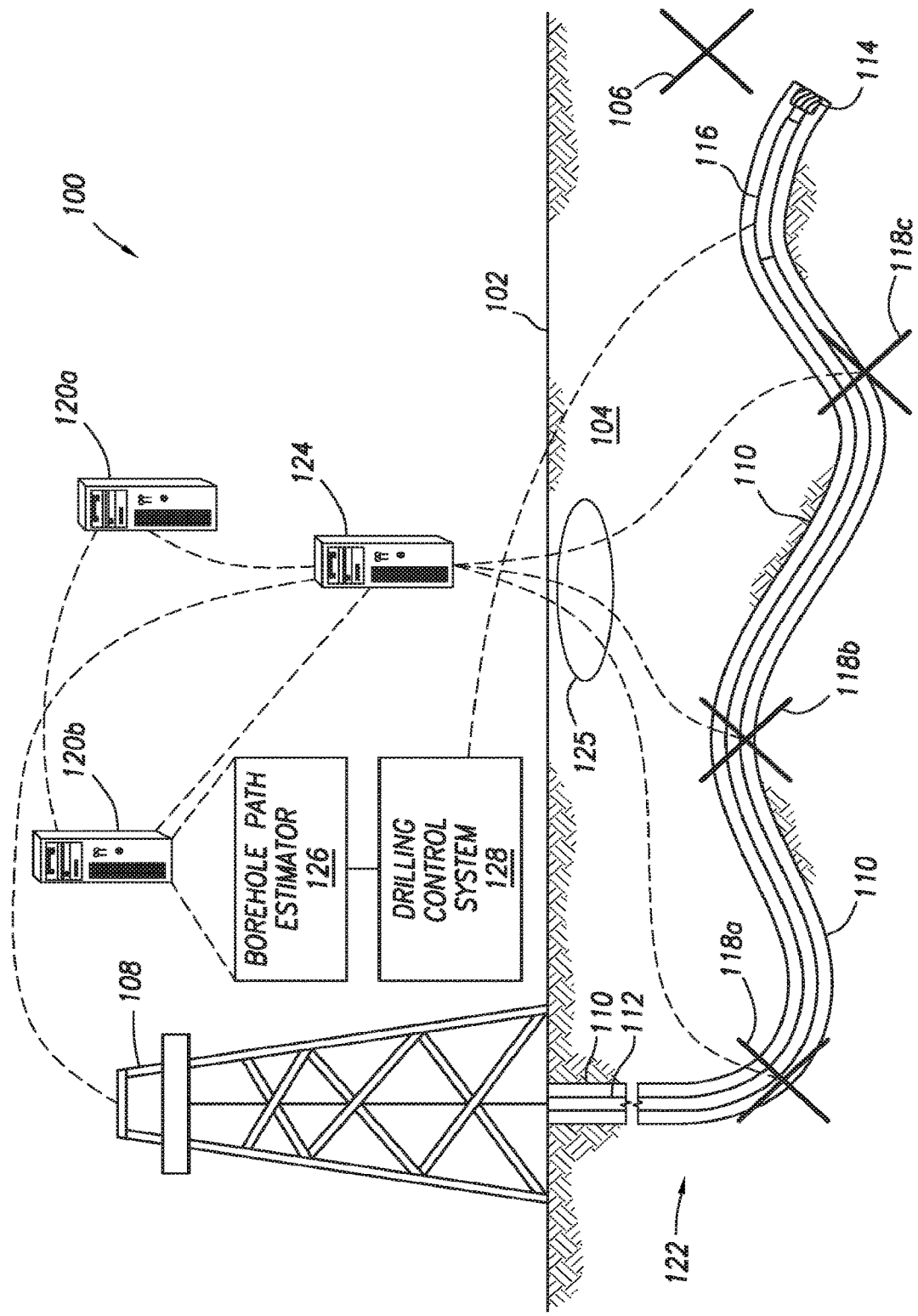
FIG. 1 shows a perspective view of a drilling environment in accordance with at least some embodiments.

FIG. 1 shows an environment 100 in which a drilling rig 108 may be used to penetrate the surface 102 of the Earth. Environment 100 may represent a terrestrial environment, where surface 102 represents land. In other embodiments, environment 100 may represent a marine environment, where surface 102 represents the bottom of a body of water such as an ocean or lake. Below the surface 102, one or several targeted locations 106 in subsurface 104, may contain minerals or hydrocarbons that will be extracted. The targeted locations are generally positioned along the planned wellbore path trajectory intended to be drilled.

Drilling rig 108 is representative of any machine such as a drill, with an ability to drill holes in to the earth's subsurface 104 and create a wellbore path, such as wellbore path 110. Drilling rig 108 may represent equipment small enough to move manually or massive structures housing equipment used to drill boreholes. Drilling techniques used by drilling rig 108 may include directional drilling, which increases the number of reserves that may be reached and can also increase production rate.

Drilling rig 108 equipment such as drilling system 122 includes drill string 112, comprising a hollow drill pipe that transmits drilling fluid and torque to a drill bit 114 coupled on a distal end of the drill string 112. In particular, the distal end of the drill string 112 comprises a bottom hole assembly (BHA) 116 that extends from the drill pipe of the drill string 112 to the drill bit 114. The BHA 116 may include drill collars, stabilizers, reamers, shocks, hole-openers, bit sub, and drill bit 114. Characteristics of BHA 116 help to determine the wellbore shape, direction, and other geometric characteristics. The BHA 116 can be of any type or variation currently used by a person of ordinary skill in the art and may include but not be limited to: a rotary assembly, a steerable mud motor, rotary steerable systems, or a fulcrum, stabilization, or pendulum assembly. The proper selection of a type of BHA 116 can ensure good directional behavior, borehole quality (smoothness of the well path as opposed to tortuous), high rate of penetration (ROP), and result in a drilling process being completed quickly and efficiently.

The directional behavior of the drilling system 122 may be defined as the manner in which the drilling system may change direction and how effectively it is able to change direction. The directional behavior of the drill depends on a complex coupling of bit directional responsiveness (bit steerability), bit walk tendency (WALK), mechanical behavior of the directional system (BHA), and the rock formation characteristics of the subsurface being drilled into.

Given the complex coupling of at least these factors, although the drill string 112 is capable of drilling a non-vertical well, or directional drilling, a resulting wellbore path 110 may be tortuous while being directed toward a given targeted location 106. Information about the actual tortuous path of the drilled wellbore path 110 may be unknown to an operator of the drilling system. An "operator" may refer to a person or people who operate or direct the operation of the drilling system, and may also be known in the industry as a directional driller, a drilling engineer, or a driller.

As the wellbore path 110 is drilled, survey data may be collected by a measurement-while-drilling (MWD) tool of the BHA 116. Survey data are comprised of measured depth, inclination, and azimuth of the well path at discrete positions (also known as survey stations) along the wellbore. For example, survey data are collected every 100 feet or so (but can also be collected more or less frequently if necessary). Survey data can then be transmitted to an electronic drilling recorder (EDR 124) at various increments of time, distance, depth, etc. during the drilling process. In some embodiments, the EDR 124 records at a 1 to 10 seconds time range based on drilling data coming from different sensors available on the rig 108, such as weight on bit (WOB), torque at surface, rotation speed, mud weight, hook load, flow rate, stand pipe pressure, differential pressure, rate of penetration, and other information pertinent to the drilling process. In FIG. 1, survey data is collected every hundred feet at locations 118a, 118b, and 118c. Survey data are then utilized to reconstruct the well path using a mathematical model such as the minimum of curvature method, to estimate the position of the well path in the Earth. However, as survey data are only collected every hundred feet or so, the position of the wellbore is not known very accurately, as opposed to survey data that would be collected every foot or so.

Directional drilling data may include more specifically how the BHA steers or guides the well path, information such as toolface orientation (TFO) (e.g., mode sliding or rotating), activation level of the rotary steerable system, and other information pertinent to the steering mode of the BHA.

Additional information corresponding to locations from which drilling data is gathered may include geological characteristics surrounding the locations such as rock formation data including unconfined or confined compressive strength (UCS or CCS) of the rock, dip/strike, and gamma ray (GR). In various embodiments, the rock formation data may generally come from acoustic logs of wells being drilled or offset wells previously drilled. In the context of embodiments of the drill model described further in FIG. 4, survey data may include the measurements of three parameters, as noted above: measured depth (MD), inclination of the borehole, and azimuth of the borehole.

Next, an example describing a method of collecting survey and drilling data is described. At location 118a, the drilling system 122 may have drilled a few hundred or thousand feet since beginning at the surface 102 and various data (for example, survey data, drilling data, and directional data) at location 118a are collected. At this juncture in the example, the drill bit 114 is located at location 118a. The drilling system 122 may proceed to drill for another hundred feet until the drill bit 114 reaches location 118b at which point additional survey data are collected. Similarly, the drilling system 122 continues to drill another hundred feet at which point the drill bit 114 is located at 118c. Additional survey data at location 118c are collected. Thus, with a survey taken every hundred feet, data about the survey locations 118a, 118b, and 118c may be known, however, the actual path 110 of the wellbore path between the survey locations 118a, 118b, and 118c is unknown, because no survey data is collected between these survey locations. The distance of one hundred feet is an example of a measurement interval, and any measurement interval may be used between surveys.

The collected survey data, in particular, the measured depth, and inclination and azimuth of the wellbore path, may be used to recreate a representation of the wellbore path using a mathematical method, such as the method of minimum curvature. For example, between two consecutive survey points (e.g., between 118a and 118b), one single geometrical arc with a given radius of curvature is generally calculated to represent the shape of the well path. However, it is known that this is not completely true as many changes of well path may occur, creating multiple small arcs, leading to tortuosity. Given the tortuous path of the wellbore, an accurate understanding of the wellbore path may be beneficial to an operator to make a better determination of the actual position of the well path relative to the reservoir or pay zone.

In various embodiments the collected survey and drilling data may be accessed while drilling is taking place, and in other embodiments, the collected survey and drilling data may be stored in one or more databases 120a, which are coupled to EDR 124. The dashed lines 125 represent any wired or wireless communication channels between equipment located at intermittent locations 118a, 118b, or 118c and the database 120a. Database 120a may represent a single machine located in a single location or several machines located in the same or disparate locations. The database 120a may be located at the drilling rig 108, at a drilling hub, or elsewhere.

In some embodiments, the survey and drilling data may be stored on a non-transitory storage media, where the storage media is computer-readable. The non-transitory computer-readable storage media may be coupled to a database 120a to transfer and store the survey data in database 120a.

When the collected survey and drilling data and rock formation data is input into a drill model, the drill model may then be used to generate a display depicting the actual path 110 of the wellbore path as well as various predictions of what a future wellbore path may be beyond the section of the earth's subsurface that has already been drilled. In various embodiments, a borehole path estimator 126 which may run on computer system 120b, may use the drill model to predict the future wellbore path. The borehole path estimator 126 may comprise a program that is executable by a processor and that may be stored on a storage device and access the various data discussed throughout (e.g., survey data, drilling data, rock formation data, etc.) and data stored in database 120a. The borehole path estimator 126 may predict both projections of the future wellbore path as well as reconstruct an actual path in accordance with the methods discussed herein.

In some embodiments, the borehole path estimator 126 is coupled to a drilling control system 128. In embodiments comprising the drilling control system 128, the drilling control system 128 controls various parameters discussed further below, such as WOB, differential pressure, RPM, drilling mode, etc. The drilling control system 128 may apply path information provided by the borehole path estimator 126 to keep the wellbore path on target. In some embodiments, the output of a borehole path estimator 126 may be shown to an operator on a display. This display is discussed now in relation to FIG. 2.

Figure 2:
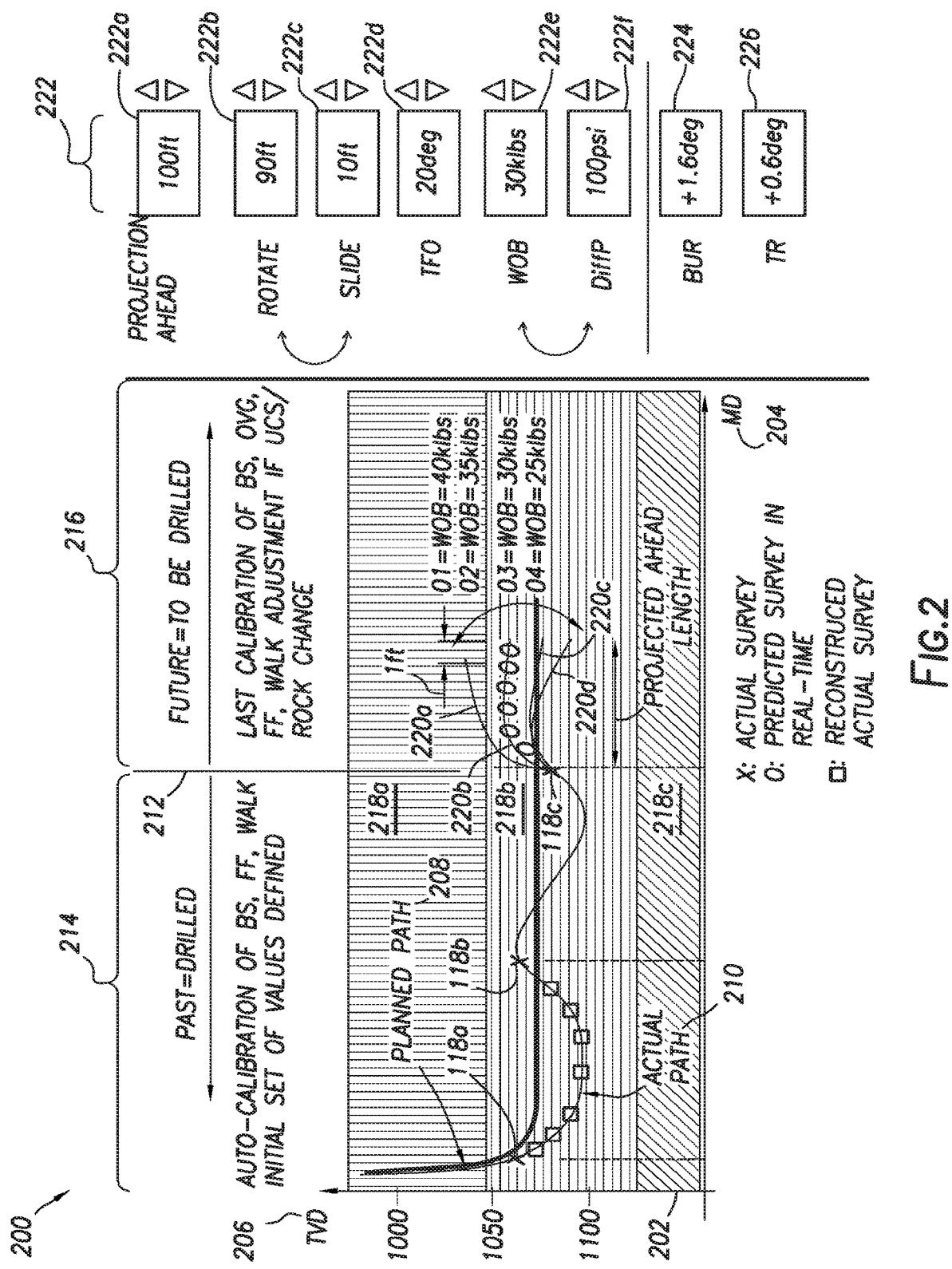
FIG. 2 shows a representation of a wellbore path in accordance with at least some embodiments.

Turning now to FIG. 2, aspects of a display 200 representing results from a drilling model are discussed. In various embodiments, the display 200 may be provided to a directional driller or drilling engineer to aid in determining a steering mode of the drilling system 122 and BHA 116 when drilling the next segment of the wellbore path 110. A method flow for running the drill model which generates the results shown in graph 202 is discussed in further detail in FIG. 3.

In a first portion of the display 200, the graph 202 depicts measured depth (MD) along the x-axis 204 and a true vertical depth (TVD) along the y-axis 206. Various layers of the rock may also be depicted in graph 202 (e.g., layers 218a, 218b, and 218c). In the embodiment shown, the display 200 is in two dimensions or 2-D, but other embodiments include a display in three dimensions or 3-D to represent the wellbore path in 3-D space.

In graph 202 a planned path 208 and an actual path 210 are shown. In the example shown in FIG. 2, the planned path 208 is less tortuous than the actual path 210 as is often the case. In various instances, an operator is aware of the planned path 208 but the operator has inaccurate knowledge of the actual path the wellbore has taken during drilling because of the unknown tortuosity. Increased knowledge of the actual path 210 may be useful in decisions related to the vertical and horizontal position of the wellbore in the Earth which is critical to staying within the payzone. Modeling software that has the ability to accurately reconstruct an actual path 210 may also have increased accuracy when constructing a future wellbore path that has yet to be drilled. Differences in vertical and horizontal position of the wellbore up to 50 feet can be observed if one does not consider well bore tortuosity.

Graph 202 is divided by a line of demarcation 212 separating section 214 and section 216. The line of demarcation 212 may correspond to the position of the drill bit 114. In section 214, a representation of a drilled portion of the wellbore path 110 is depicted, and in section 216 various representations of possible directions the wellbore path 110 may take with further drilling, are depicted. Thus, the portion of earth represented in section 216 has not yet been drilled. Accordingly, portions of both an actual wellbore path (e.g., wellbore path 110) and an undrilled section of the wellbore path are represented in graph 202.

To reconstruct the actual path of a wellbore path an underlying drill model may use step by step calculations to determine the actual path 210. For example, although survey data from surveys 118a, 118b, and 118c may provide some information about the orientation and location of the wellbore path at discrete points, additional and more robust information may be gleaned from drilling and directional data in conjunction with the borehole path estimator. As mentioned previously, the EDR 124 collects drilling and directional data continuously during drilling, or more frequently than survey data is gathered, for example, at a frequency of every foot of measured depth drilled. This data may be used by a borehole path estimator 126 to reconstruct an actual path 210 of a drilled wellbore path 110.

Various inputs to the drill model used to reconstruct the actual path 210 may be calibrated by comparing an expected result and an output of the drill model, where the output is used to generate the reconstruction of the actual path 210. More specifically, one set of input parameters that may be modified include: bit steerability (BS), walk angle (WALK), overgauge (OVG) borehole, and coefficient of friction (FF). In some embodiments, the initial set of parameters may be either estimated by a modeling software or simply set as defaults, given that, for example, BS is around 0.1, WALK is around −12 degrees, OVG is about ⅛ inch, and FF is around 0.2.

Once the various inputs have been calibrated and an actual path 210 is produced that falls within an acceptable margin of error threshold, the various inputs and additional known data of the formations remaining to be drilled may be used to predict a future wellbore path. In various embodiments, a future wellbore path may be defined as a portion of the wellbore that has not yet been drilled. The future wellbore path may be a representation of a prediction of the location and path that may form once a segment of the earth's subsurface has been drilled. The path of a future wellbore may depend on a variety of factors including the drilling parameters, the drilling bit, the BHA, and type of rock being drilled.

Referring to section 216, where predicted future wellbore paths are shown, a plurality of future trajectories 220a, 220b, 220c, and 220d are represented. The future trajectories 220a, 220b, 220c, and 220d are generated based on any known prediction methodology, and utilizing the modified input parameters of the drill model. Furthermore, the future trajectories 220a, 220b, 220c, and 220d are displayed in real-time based on operating parameters selected by the operator by way of buttons 222. This enables the operator to choose operating parameters that the operator wants to achieve a desired trajectory. In various embodiments, the operator may have a goal of remaining as close as possible to a planned trajectory for a wellbore path, minimizing dog legs, and maximizing a Rate of Penetration (ROP).

For example, given the various drilling parameters specified by the operator by way of buttons 222, the drill model predicts the resulting future wellbore paths 220a, 220b, 220c, and 220d corresponding to four different WOBs. Each future wellbore path is specific to one set of parameters. More specifically, a wellbore path may be formed according to future wellbore path 220a if, for example, a WOB of forty kilo-pounds is applied. As one of the abilities to vary the directional tendency of the assembly comes from varying the WOB, modifying the WOB effectively tunes the directional tendency of the BHA 116 and thus the drilling system 122. Accordingly, with a WOB of thirty-five kilo-pounds, the drill model predicts a wellbore path may be formed according to the different future wellbore path 220b.

As mentioned above, various buttons 222 provide an operator with the ability to select various drilling parameters to see how varying the parameters may impact future wellbore paths. The button 222a enables an operator to control the distance ahead the operator would like to see. The operator may be planning to drill a next section of the subsurface of the earth, where the next section is a hundred feet long. Thus, in display 200, setting button 222a to one hundred feet makes it such that the future wellbore paths 220a, 220b, 200c, and 220d are shown out to one hundred feet.

Button 222b allows an operator to specify a distance the drilling system 122 rotates, and button 222c allows the operator to specify a distance the drilling system 122 slides, while using, for example, a steerable mud motor. Additionally, the operator may specify parameters such as the tool face orientation (TFO), WOB, and differential pressure, which are buttons 222d, 222e, and 222f, respectively. The WOB and differential pressure are normally linked or coupled, as the differential pressure represents the difference in pressure when the bit is off-bottom (WOB=0) and on-bottom (WOB>0). As a consequence, the operator can select one or the other.

The rotate and slide buttons (222b and 222c) reference the ability of drilling system 122 to alternate between a rotating and sliding mode. In a rotating mode, an entire drill string 112 may be rotated by a drilling rig's rotary table or topdrive. In the rotation mode, the drilling system 122 may maintain a straight drilling path. If a drilling system 122 deviates from an intended course while in rotating mode, the sliding mode may be used. In the sliding mode, the drill-string 112 does not rotate; instead the drill bit 114 may be turned by a downhole motor, and the wellbore path may be drilled in the direction the drill bit 114 is pointing. The direction the drill bit 114 is pointing may be controlled by TFO.

The TFO defines an orientation of the deflection tool (e.g., downhole motor), which controls the direction of drilling. The deflection tool is oriented in a particular direction to make a desired deflection within the wellbore. In one example, the toolface orientation may be based on High Side (TFO=0 degrees) or Low Side (TFO=180 degrees), where the TFO is measured from the high side of the borehole in a plane perpendicular to the axis of the hole.

The WOB is the amount of downward force exerted on the drill bit 114 and in some embodiments may be measured in thousands of pounds. Differential pressure defines a pressure of the drilling fluid and may be measured in pounds per square inch, and represents the difference in pressure when the bit is off-bottom (WOB=0) and on-bottom (WOB>0).

Given the parameters set by the operators at buttons 222b, 222c, 222d, 222e, and 222f, the underlying borehole path estimator 126 may utilize the drill model to output a build up rate (BUR) indicator 224, and a turn rate (TR) indicator 226 over the course length selected at 222a. The directional behavior of the system can be quantified by the build or drop rate of the system and the turn rate of the system. The build or drop rate may be further defined as the rate of change of the inclination of the wellbore over a given distance. The turn rate may be further defined as the rate of azimuth change over the same given distance. An example unit for a build/drop rate and turn rate is degree/100 ft.

Figure 3:
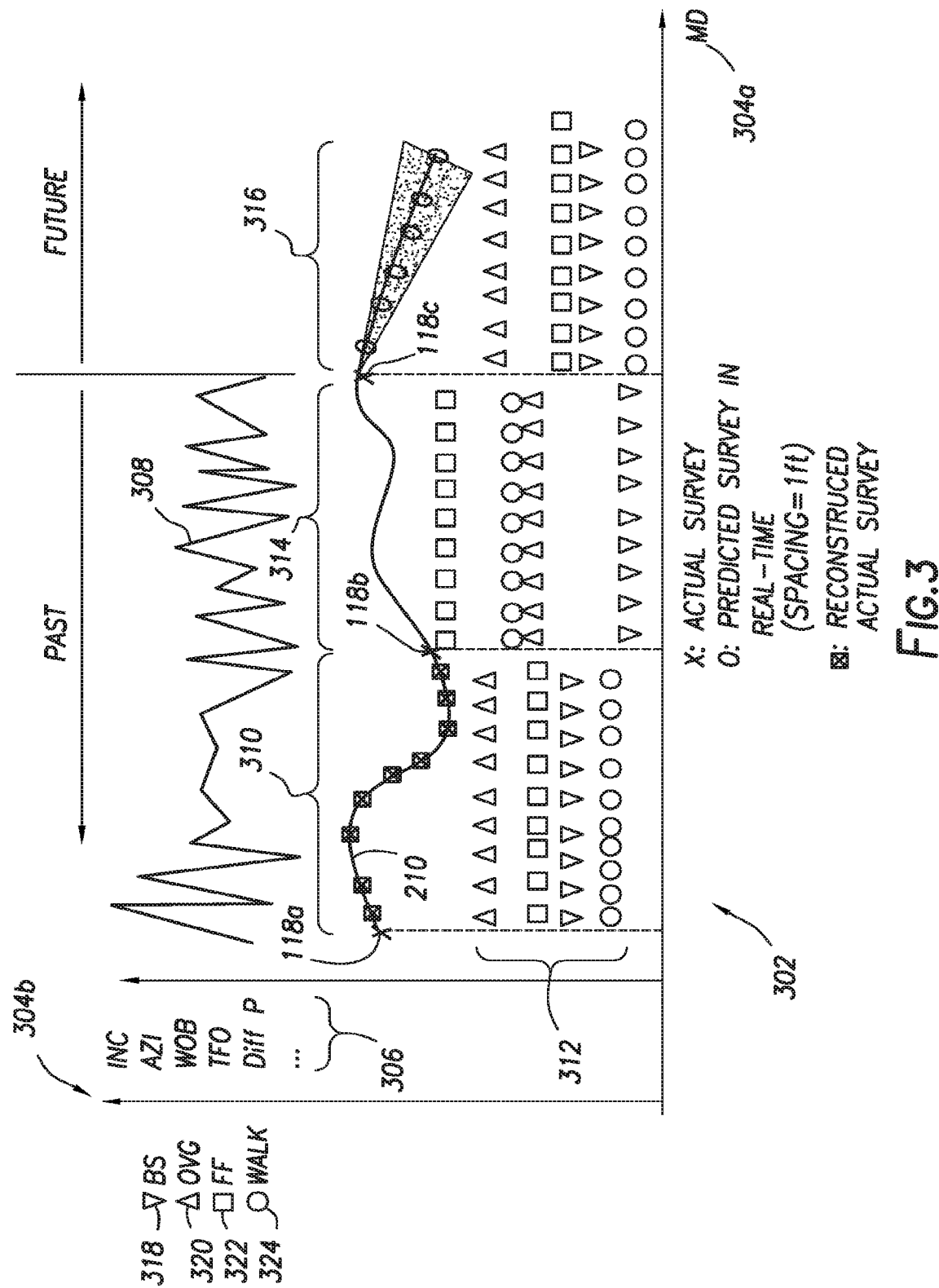
FIG. 3 shows a graph depicting aspects of various parameters corresponding to an earth model in accordance with several embodiments.

Turning now to FIG. 3, a plot 302 showing a log of an initial set of parameters specifically used by the drill model are shown. The four parameters: bit steerability (BS) 318, overgauge (OVG) 320, coefficient of friction (FF) 322, and bit walk tendency (Walk) 324, are utilized in conjunction with operating parameters, rock formation data, drill bit data, and BHA data to both reconstruct an actual path of the wellbore 210 and generate predictions of possible future wellbore paths 220a, 220b, 220c, and 220d. In various embodiments, the four parameters BS 318, OVG 320, FF 322, and Walk 324 are calibrated as the actual path of the wellbore 210 is reconstructed and the calibrated four parameters may be further utilized to generate the plurality of future trajectories 220a, 220b, 220c, and 220d that are generated by the drill model.

In the plot 302, a measured depth (MD) is shown along the x-axis 304a. Along the y-axis 304b are values of the various parameters in column 306 shown in the plot 302. Line 308 may depict values of a parameter in column 306, for example, the line 308 may represent values of the WOB for the respective sections of the actual path 210. The values of the parameters in column 306 (e.g., WOB) may be taken from EDR 124 and the values of the parameters may be used to calibrate the initial set of parameters including the BS 318, OVG 320, FF 322, and WALK 324.

The BS 318 and WALK 324 are parameters that define the directional behavior of the drill bit 114, while the OVG 320 and FF 322 are parameters representing additional factors that affect the directional behaviors of a system in a given rock formation. As discussed previously in relation to FIG.

2, the directional behavior of a system can be quantified by the build or drop rate and the turn rate of the system. The directional behavior of the drill bit 114 may be characterized by its walk tendency (WALK) and bit steerability (BS).

The BS 318 corresponds to the ability of the drill bit 114 to initiate a lateral deviation, taking into account the lateral and axial forces placed on the drill bit 114. The BS 318 can be defined as the ratio of lateral vs. axial drillability $$B_s = D_{lat}/D_{ax} \qquad (1)$$

where $D_{lat}$ represents the lateral drillability, defined as the lateral displacement per bit revolution versus the side force. $D_{ax}$ represents the axial drillability, which is the axial penetration per bit revolution versus the WOB. The BS 318, which may be equivalent to the bit anisotropic index, may fall generally in the range of 0.02 to 0.4 for various embodiments of the drill bit 114. The value of the BS 318 may depend on the cutting profile, gauge cutters, gauge pad characteristics, and rock hardness (UCS). A high BS value (high steerability) for a drill bit implies a strong propensity for lateral deviation, which may enable maximum dogleg potential.

The WALK 324 may be further quantified by a walk angle which is the angle measured in a plane perpendicular to the drill bit axis, between the direction of the side force applied to the bit 114 and that of the lateral displacement of the bit 114. The walk angle quantifies the intrinsic azimuth behavior of the bit 114.

The FF 322 is a value ranging generally from 0.1 to 0.5, and represents the ratio between the force necessary to move the tubular or downhole tools through the borehole and the pressure between the surfaces of the tubular or downhole tools and the borehole. The FF 322 has an influence on the directional behavior of the system, especially the turn rate of the system; the FF 322 may depend on the type of drilling fluid and type of rock.

During the process of drilling a wellbore path, a resulting borehole size may be slightly higher than the nominal size of the drill bit 114, which in turn may create an overgauge (OVG) borehole. In several embodiments, the overgauge may range generally from 0 to 2 inches over the nominal size, and the OVG has an impact on the deflection and contact forces of the BHA 116, and thus on the build/drop rate of the system.

The four parameters including the BS 318, OVG 320, FF 322, and WALK 324 have a value in each segment of the reconstructed actual path 210. A segment of the reconstructed actual path 210 is a portion between two survey points. The survey points are identified by X's. While predicted survey points are identified by O's. For example, in segment 310, the values of the four parameters BS 318, OVG 320, FF 322, and WALK 324 are plotted in section 312. In the subsequent segment 314 of the actual path 210, the four parameters BS 306, OVG 308, FF 310, and WALK 312 are recalibrated and thus have different values in the segment 314.

In the segment 316, a future wellbore path is predicted. The values of the four parameters BS 318, OVG 320, FF 322, and WALK 324 are chosen based on their values in the previous segment 314. An uncertainty level may be defined to provide uncertainty about the prediction, where the uncertainty level is based on previous variation of the calibrated parameters BS 318, OVG 320, FF 322, and WALK 324. Various embodiments of a method that may be used to generate the values of the four parameters BS 318, OVG 320, FF 322, and WALK 324 are discussed next.

Figure 4:
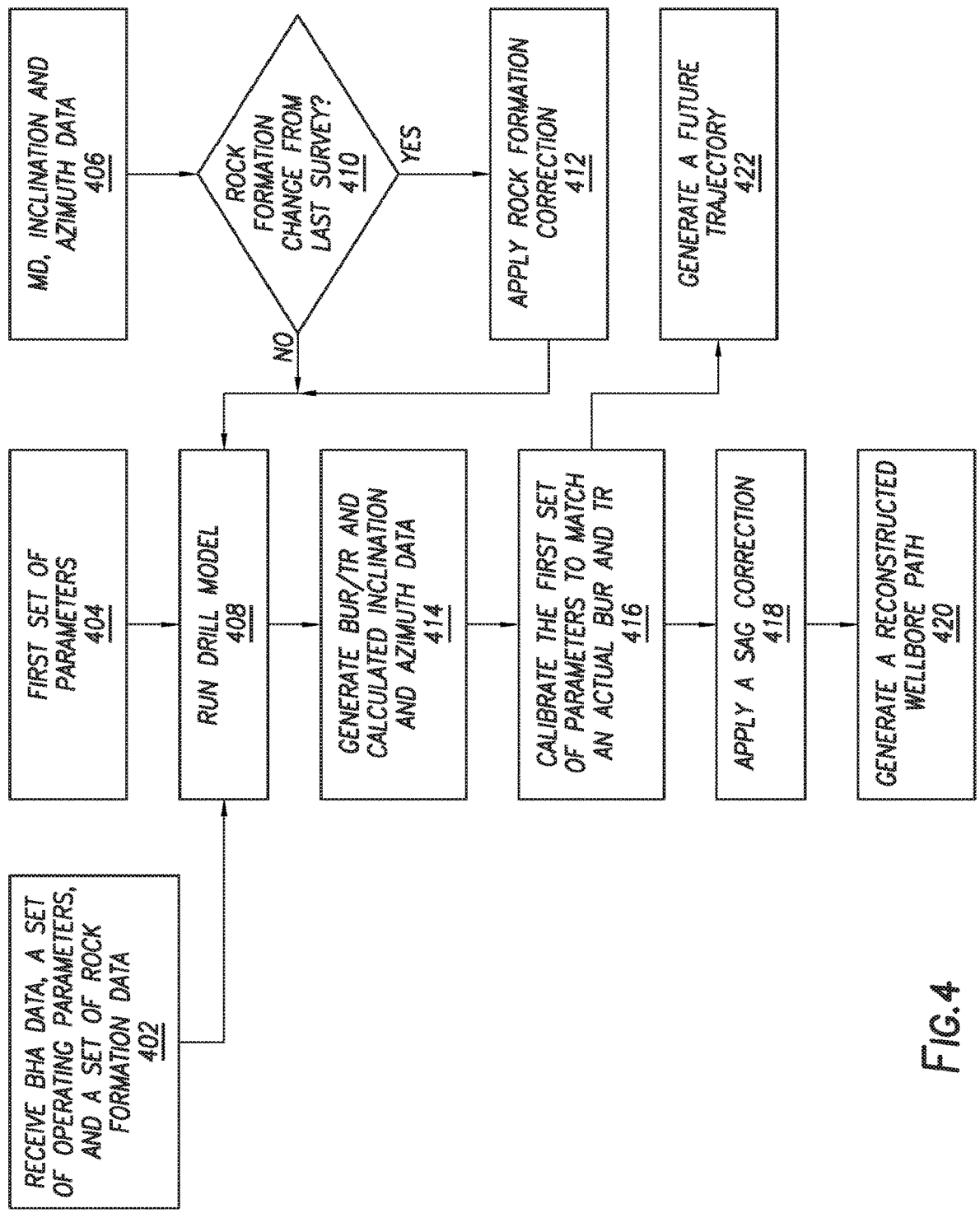
FIG. 4 shows a method diagram in accordance with several embodiments.

Turning now to FIG. 4, a method that may be used to reconstruct an actual wellbore path 210 and a plurality of future trajectories 220a, 220b, 220c, and 220d is shown. The below method may be implemented by the borehole path estimator 126. In the flow diagram, blocks 402, 404, and 406 represent steps in which various data are collected to the drill model in block 408. At block 402, a computer system may receive various data such as BHA data, a set of operating parameters, and a set of rock formation data. The BHA data may include both data corresponding to the drill bit 114 as well as the BHA 116/string data.

Operating parameters may include data such as mud weight, WOB, differential pressure, TFO, activation level, RPM and flow rate. The BHA data are generally received from the directional drilling company through a report stating all elements starting from the drill bit, with all length internal and external dimensions, weight, etc. Operating parameters may be received from the EDR 124, which in turn received the data from the drilling rig 108. Additionally, rock formation data may include hardness of the rock defined as the Unconfined or Confined Compressive Strength (UCS/CCS) values, dip/strike, and gamma ray (GR). In some embodiments, the rock formation data may be received from an acoustic logger. An acoustic logger may measure characteristics of sound waves propagated through a wellbore environment. In some embodiments, the acoustic logging may be done in offset wells that have previously been drilled in the wellbore environment. Several parameters may be taken or inferred from an acoustic log including density, elastic properties, hardness of the rock, etc.

At block 404, the first set of parameters includes initial values of BS, OVG, FF, and WALK. In various embodiments, planned and initial values for the BS, OVG, FF, and WALK may be predetermined for the entire segment to drill and may be based on directional drilling, planning, rock formation, and drill bit characteristics. The initial values BS, OVG, FF, and WALK will be calibrated during drilling based on actual data collected during the drilling.

At block 406, data corresponding to a measured depth (MD), azimuth, and inclination may be collected from a prior survey. For example, the prior survey may be a survey at the beginning of a respective segment of the wellbore path. For example when reconstructing an actual path of the wellbore such as segment 310 (FIG. 3), the MD, azimuth, and inclination data in block 406 may come from survey 118a (FIG. 3). At decision block 410, a determination is made regarding whether a rock formation change has occurred since the prior survey. In various embodiments, actual rock formation data may be collected from an acoustic logger, where the acoustic logger collects data in an offset well located in the area where the segment of the wellbore path being reconstructed is located.

A determination may be made that a difference between the set of rock formation data received in block 402 and the actual rock formation data is above a predetermined threshold, and thus accordingly a rock formation change has occurred. Changes in rock formation may include a change in hardness. A detection of a change in rock formation may occur when drilling in rock with anisotropic characteristics, where various properties of the rock are directionally dependent. Upon a determination that a rock formation change has occurred, the flow proceeds to block 412, where a rock formation correction may be applied to the measured depth, inclination and azimuth data. The rock formation correction may include applying an external side force at the bit due to the rock anisotropy as known by drillers when drilling rock formations that present bedding planes, or interbedded layers (from hard to soft rocks, or vice versa), as described in publication SPE14764 (1987).

If a determination is made that no rock formation changes have occurred, the flow does not apply a rock formation correction and instead provides the MD, inclination, and azimuth data (406) to the drill model in block 408.

Upon collecting data in blocks 402, 404, and 406, the drill model runs in block 408. The drill model may be any type of known 3D-rock-bit-BHA model known in the art used to model the directional behavior of a drilling system. At block 408, the drill model is run to generate an output including a calculated BUR, calculated TR, calculated inclination, and calculated azimuth. The results including the calculated BUR, TR, inclination, and azimuth may be presented numerically and plotted to predict the next future trajectory (e.g., 220a).

An initial plot of the actual path of the wellbore may be reconstructed by the drill model every foot or so (reconstructed survey), using the calculated BUR, TR, inclination, and azimuth. At block 416, the four parameters, BS, OVG, FF, and WALK, may be calibrated based on received data corresponding to an actual BUR and TR. More specifically, calibrating the four parameters, BS, OVG, FF, and WALK, may entail minimizing an error between the actual and reconstructed surveys at a given depth using the four parameters and rock formation effects. More specifically, the difference between a measured and calculated inclination and azimuth may be minimized such that the difference could be between +/−0.05 degree accuracy, for example.

Any mathematical or computing technique may be used that varies the four parameters within an admissible range until a solution is found that minimizes the error or difference between the actual and reconstructed surveys. For example the drill model may use artificial intelligence, machine learning techniques such as neural network techniques, or any other known techniques for calibration, adjustment, and minimization.

In generating a final reconstructed actual path, the flow proceeds to block 418 where a sag correction may be applied, or any other survey correction, such as but not limited to pipe stretch correction, thermal effects, magnetic interference, multi-station correction, etc. The sag corresponds to the difference in angle between the borehole axis and the measurement tool axis. Upon application of the sag correction to the initial plot of the actual path, the final reconstructed actual path is generated in block 420. At block 422, the drill model may use the calibrated four parameters (416) to generate one or more future trajectories as well. In various embodiments, the one or more future trajectories are based on operating parameters selected by the operator including drilling mode (sliding/rotating), and system parameters such as rotary steerable system (RSS), steerable mud motor, TFO, WOB, and differential pressure.

In one example of performing the method described in FIG. 4, an operator may plan to drill a particular, first segment that is 100 feet long. The drilling control system 128 may have a visual interface generated by the drill model, similar to the one described in FIG. 2. The visual interface allows the operator to visualize, in 2-D or 3-D, and in real-time the predicted future trajectory based on operating parameters selected by the operator, by way of buttons 222. The drill model can enable an operator to achieve drilling goals such as remaining as close as possible to a planned trajectory, minimizing dog legs, and maximizing a rate of penetration (ROP).

A predictive and desired trajectory may be estimated by the drill model based on a calculated BUR and calculated TR for a given BS, FF, OVG, and WALK. The calculated BUR and TR are generated by the 3-D rock-bit-BHA model. At the end of drilling the first segment, a survey is taken and the four parameters BS, FF, OVG, and WALK are calibrated to match an actual BUR and TR achieved during the drilling of the first segment. These calibrated four parameters are then used to reconstruct the actual path of the wellbore in the first segment and the inclination and azimuth are calculated every foot or so during the reconstruction of the actual path. The calibrated four parameters, as well as possible rock formation change corrections, are fine-tuned and used to predict future trajectories in the next segment to be drilled. A steering mode or various operating parameters of the drilling system 122 and BHA 116 may be determined or altered based on the predicted future trajectories. In generating the actual path, a sag correction may also be applied to produce a more accurate representation of the reconstructed actual path. This process may be repeated for all subsequent sections that are to be drilled.

Figure 5:
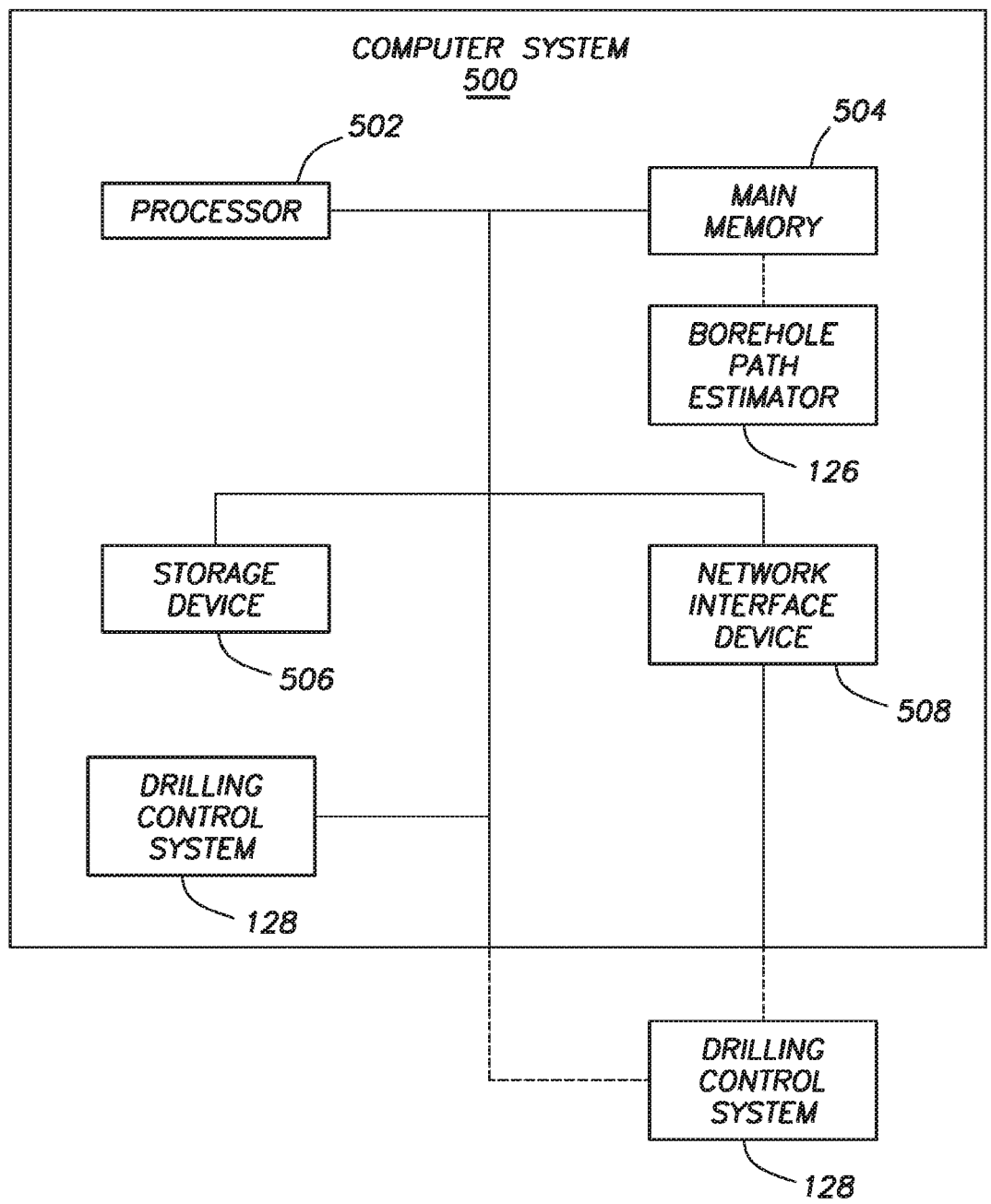
FIG. 5 shows, in block diagram form, a computer system in accordance with at least some embodiments.

FIG. 5, shows a computer system 500 which is illustrative of a computer system that may perform method steps in accordance with the method discussed in FIG. 4. The computer system 500 may be illustrative of, for example, a laptop, a desktop computer, a computer within a node of several computers, or any other computing system that may be connected to a network of computers. The computer system 500 comprises a processor 502, and a main memory 504 coupled to processor 502. Additionally, processor 502 and main memory 504 may be coupled to storage device 506, and a network interface device 508.

Programs, such as the borehole path estimator 126, executable by the processor 502 may be stored on the storage device 506 (e.g., a hard drive, solid state disk, memory stick, optical disc), and accessed when needed by the processor 502. Programs stored on the storage device 506, such as the borehole path estimator 126, may comprise programs to implement various processes on the computer system 500, including method steps in accordance with the method discussed above in FIG. 4. In some cases, the programs are copied from the storage device 506 to the main memory 504, and the programs are executed from the main memory 504. Thus, both the main memory 504 and storage device 506 shall be considered computer-readable storage mediums.

In various embodiments, network interface device 508 may allow computer system 500 to exchange data over a wireless or wired network. For example, where the computer system 500 is representative of computer system 120b, the network interface device 508 may allow computer system 120b to exchange data over a wireless or wired network with database 120a. In some embodiments the computer system 500 may be connected to a plurality of other computers within a shared network. Thus, while many aspects of the method discussed in FIG. 4 may be performed serially, various embodiments enable parallel processing to speed up the overall processing time. Performing the method described in FIG. 4 may comprise major computational elements, however these procedures may be performed in parallel processes.

The borehole path estimator 126 may control the drilling control system 128. The drilling control system 128 may be communicatively coupled to BHA 116 or drilling rig 108 where the drilling control system 128 controls various operating parameters of the drill to keep the wellbore path on target. The drilling control system 128 may receive signals from the borehole path estimator 126 which determine the specifics of operating the drill.

From the description provided herein, those skilled in the art are readily able to combine software with appropriate general-purpose or special-purpose computer hardware to create a computer system and/or computer sub-components in accordance with the various embodiments and methods, for example, as discussed with regards to method 300.

References to "one embodiment," "an embodiment," "some embodiments," "various embodiments," or the like indicate that a particular element or characteristic is included in at least one embodiment of the invention. Although the phrases may appear in various places, the phrases do not necessarily refer to the same embodiment or example.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A computer-implemented method of modeling a wellbore path in an earth model, the method comprising:
receiving, from an electronic drilling recorder (EDR) coupled to a bottom hole assembly (BHA) of a drilling rig, a set of BHA data, and a set of operating parameters data;
receiving a set of rock formation data;
generating, by a computer system, a representation of a wellbore path in a first section of the earth model, by assessing the set of BHA data, the set of operating parameters data, the set of rock formation data, and a first set of parameters quantifying bit steerability, walk, coefficient of friction, and overgauge borehole information;
modifying, by the computer system and based on data received from a survey corresponding to the first section of the earth model, the first set of parameters to generate a second set of parameters; and
generating, by the computer system, a future wellbore path in a second section of the earth model by applying the second set of parameters.

2. The computer-implemented method of claim 1, wherein generating the representation of the wellbore path further comprises:
generating a reconstructed trajectory of the wellbore path based on a calculated build up rate (BUR) and calculated turn rate (TR) of a drill string; and
generating a reconstructed actual trajectory of the wellbore path based on an actual BUR and actual TR of the drill string.

3. The computer-implemented method of claim 2,
wherein generating the reconstructed trajectory of the wellbore path further comprises calculating the calculated BUR and calculated TR based on the first set of parameters; and
wherein generating the reconstructed actual trajectory of the wellbore path further comprises:
receiving actual BUR and actual TR corresponding to the first section of the earth model;
calibrating the first set of parameters based on the actual BUR and the actual TR to generate the second set of parameters; and
modifying the future wellbore path based on the second set of parameters to generate the actual trajectory.

4. The computer-implemented method of claim 2, wherein generating the reconstructed actual trajectory of the wellbore path further comprises:

calculating a sag correction; and
applying the sag correction to the representation of the wellbore path; and
generating a calibrated wellbore path in response to applying the sag correction.

5. The computer-implemented method of claim 1, wherein generating the future wellbore path further comprises:
receiving actual build up rate (BUR) and actual turn rate (TR) corresponding to the first section of the earth model;
calibrating the first set of parameters based on the actual BUR and the actual TR to generate the second set of parameters; and
generating the future wellbore path based on the second set of parameters.

6. The computer implemented method of claim 5, wherein generating the future wellbore path further comprises:
receiving measured depth, inclination, and azimuth data from a survey, corresponding to the first section of the earth model;
receiving, from an acoustic logger, actual rock formation data corresponding to the first section of the earth model;
calibrating the second set of parameters based on the actual rock formation data to generate a third set of parameters; and
generating the future wellbore path based on the third set of parameters.

7. A drilling system comprising:
a drill string comprising a bottom hole assembly coupled to a distal end of the drill string;
an electronic drilling recorder (EDR) coupled to the BHA; and
a computer system coupled to the electronic drilling recorder, the computer system comprising:
a processor;
a memory coupled to the processor;
the memory storing a program that, when executed by the processor, causes the processor to:
receive, from the EDR, a set of data, where the set of data comprises: BHA data, operating parameters data, and rock formation data;
provide the set of data and a first set of parameters quantifying bit steerability, walk, coefficient of friction, and overgauge borehole information to an earth model;
generate a representation of a wellbore path in a first section of the earth model based on the provided set of data and the first set of parameters;
receive data from a survey corresponding to the first section of the earth model; and
modify the representation of the wellbore path to generate an actual trajectory of the wellbore path based on the data received from the survey.

8. The drilling system of claim 7, wherein responsive to the processor modifying the representation of the wellbore path to generate an actual trajectory, the program further causes the processor to:
modify the first set of parameters, based on data received from the survey, to generate a second set of parameters; and
generate the actual trajectory of the wellbore path in the first section of the earth model by applying the second set of parameters.

9. The drilling system of claim 8, wherein the program further causes the processor to:

receive, from an acoustic logger, actual rock formation data corresponding to the first section of the earth model;
determine that a difference between the set of rock formation data and the actual rock formation data is above a predetermined threshold;
calibrate the second set of parameters based on the actual rock formation data to generate a third set of parameters; and
generate a future wellbore path in a second section of the earth model by applying the third set of parameters.

10. The drilling system of claim 9 further comprising:
a display device coupled to the computer system; and
wherein the program further causes the processor to render for display on the display device, the actual trajectory of the wellbore path in the first section of the earth model and the second future wellbore path in the second section of the earth model.

11. The drilling system of claim 7, wherein responsive to the processor modifying the representation of the wellbore path to generate the actual trajectory of the wellbore path, the program causes the processor to:
calibrate the first set of parameters based on an actual build up rate (BUR) and turn rate (TR) to generate a second set of parameters;
calculate a sag correction; and
apply the sag correction and second set of parameters to the representation of the wellbore path to generate a calibrated wellbore path.

12. The drilling system of claim 11, further comprising:
a display device coupled to the computer system,
wherein the program further causes the processor to render for display on the display device, the calibrated wellbore path.

13. The drilling system of claim 11, wherein the program further causes the processor to: generate a future wellbore path in a second section of the earth model by applying the second set of parameters.

14. A directional drilling system configured to steer a bottom hole assembly (BHA) comprising:
a network interface;
a display;
a processor; and
a memory coupled to the processor, the memory storing a program that, when executed by the processor, causes the processor to:
receive, data obtained from an electronic drilling recorder (EDR) coupled to the BHA, a set of BHA data, and a set of operating parameters data, and a set of rock formation data;
generate, on the display, a representation of a wellbore path in a first section of an earth model, by assessing the set of BHA data, the set of operating parameters data, the set of rock formation data, and a first set of parameters quantifying bit steerability walk, coefficient of friction, and overgauge borehole information;
modify, based on data received from a survey corresponding to the first section of the earth model, the first set of parameters to generate a second set of parameters; and
generate, on the display, a future wellbore path in a second section of the earth model by applying the second set of parameters.

15. The directional drilling system of claim 14, wherein responsive to the processor generating a representation of the wellbore path, the program further causes the processor to:

generate a reconstructed trajectory of the wellbore path based on a calculated build up rate (BUR), a calculated turn rate (TR) of a drill string; and the first set of parameters;

receive actual BUR and actual TR corresponding to the first section of the earth model;

calibrate the first set of parameters based on the actual BUR and the actual TR;

modify the reconstructed trajectory of the wellbore path based on the second set of parameters to generate an actual trajectory;

calculate a sag correction; and apply the sag correction to the actual trajectory to generate a calibrated wellbore path in the first section of the earth model.

16. The directional drilling system of claim 15, wherein responsive to the processor generating a future wellbore path, the program further causes the processor to:

receive, from an acoustic logger, actual rock formation data corresponding to the first section of the earth model;

determine that a difference between the set of rock formation data and the actual rock formation is above a predetermined threshold;

calibrate the second set of parameters based on the actual rock formation data to generate a third set of parameters; and generate a second future wellbore path based on the third set of parameters.

17. The directional drilling system of claim 15, wherein responsive to the processor generating a future wellbore path, the program further causes the processor to:

generate the future wellbore path based on the second set of parameters.

* * * * *